United States Patent
Ali et al.

(10) Patent No.: US 10,211,278 B2
(45) Date of Patent: Feb. 19, 2019

(54) DEVICE AND METHOD FOR A THIN FILM RESISTOR USING A VIA RETARDATION LAYER

(71) Applicant: Texas Instruments Incorporated, Dallas, TX (US)

(72) Inventors: Abbas Ali, Plano, TX (US); Dhishan Kande, Dallas, TX (US); Qi-Zhong Hong, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/646,917

(22) Filed: Jul. 11, 2017

(65) Prior Publication Data

US 2019/0019858 A1 Jan. 17, 2019

(51) Int. Cl.
| | |
|---|---|
| *H01L 49/02* | (2006.01) |
| *H01L 21/3213* | (2006.01) |
| *H01L 21/311* | (2006.01) |
| *H01L 21/768* | (2006.01) |
| *H01L 21/027* | (2006.01) |
| *H01L 21/02* | (2006.01) |

(Continued)

(52) U.S. Cl.
CPC ........ *H01L 28/24* (2013.01); *H01L 21/02063* (2013.01); *H01L 21/0273* (2013.01); *H01L 21/31116* (2013.01); *H01L 21/31144* (2013.01); *H01L 21/32136* (2013.01); *H01L 21/32139* (2013.01); *H01L 21/76802* (2013.01); *H01L 21/76877* (2013.01); *H01L 23/528* (2013.01); *H01L 23/5226* (2013.01); *H01L 23/5228* (2013.01); *H01L 23/53209* (2013.01); *H01L 23/53295* (2013.01)

(58) Field of Classification Search
CPC .............. H01L 28/24; H01L 21/02063; H01L 21/76829; H01L 21/76802; H01L 23/5226; H01L 23/5228
See application file for complete search history.

(56) References Cited

U.S. PATENT DOCUMENTS 8,319,597 B2 * 11/2012 Privitera .................. H01C 7/06
                                                    338/22 R
8,426,745 B2 *  4/2013 Gaul ................... H01L 23/5228
                                                    174/260

(Continued)

*Primary Examiner* — Syed Gheyas
(74) *Attorney, Agent, or Firm* — Jacqueline J. Garner; Charles A. Brill; Frank D. Cimino

(57) ABSTRACT

A device and method for fabricating an integrated circuit (IC) chip is disclosed. The method includes depositing a first thin film resistor material on a first inter-level dielectric (ILD) layer; depositing an etch retardant layer overlying the first thin film resistor material; and patterning and etching the etch retardant layer and the first thin film resistor material to form a first resistor. The method continues with depositing a second ILD layer overlying the first resistor; and patterning and etching the second ILD layer using a first etch chemistry to form vias through the second ILD layer and the etch retardant layer to the first resistor. The etch retardant layer is selective to a first etch chemistry and the thickness of the etch retardant layer is such that the via etching process removes substantially all exposed portions of the etch retardant layer and substantially prevents consumption of the underlying first thin film resistor material.

14 Claims, 8 Drawing Sheets

(51) Int. Cl.
*H01L 23/528* (2006.01)
*H01L 23/522* (2006.01)
*H01L 23/532* (2006.01)

(56) References Cited

U.S. PATENT DOCUMENTS

| | | | |
|---|---|---|---|
| 2005/0260822 A1* | 11/2005 | Keum | H01L 23/5223 438/382 |
| 2007/0069334 A1* | 3/2007 | Beach | H01L 23/5228 257/536 |
| 2010/0237467 A1* | 9/2010 | Dalton | H01L 21/76816 257/536 |
| 2013/0323625 A1* | 12/2013 | Tu | G03F 1/36 430/5 |
| 2015/0187632 A1* | 7/2015 | Ali | H01L 23/5228 257/537 |
| 2017/0082917 A1* | 3/2017 | Fukaya | G03F 1/46 |

* cited by examiner

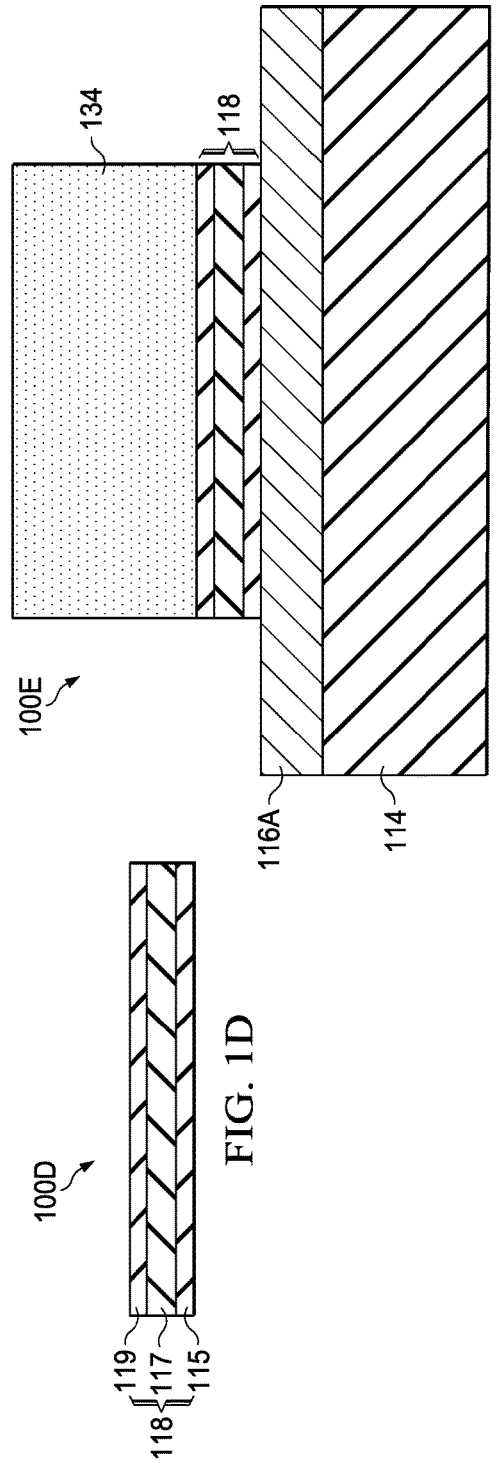

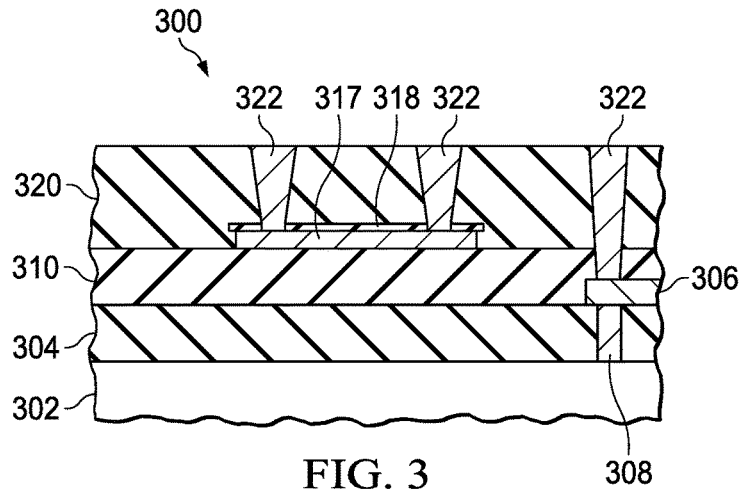
FIG. 3
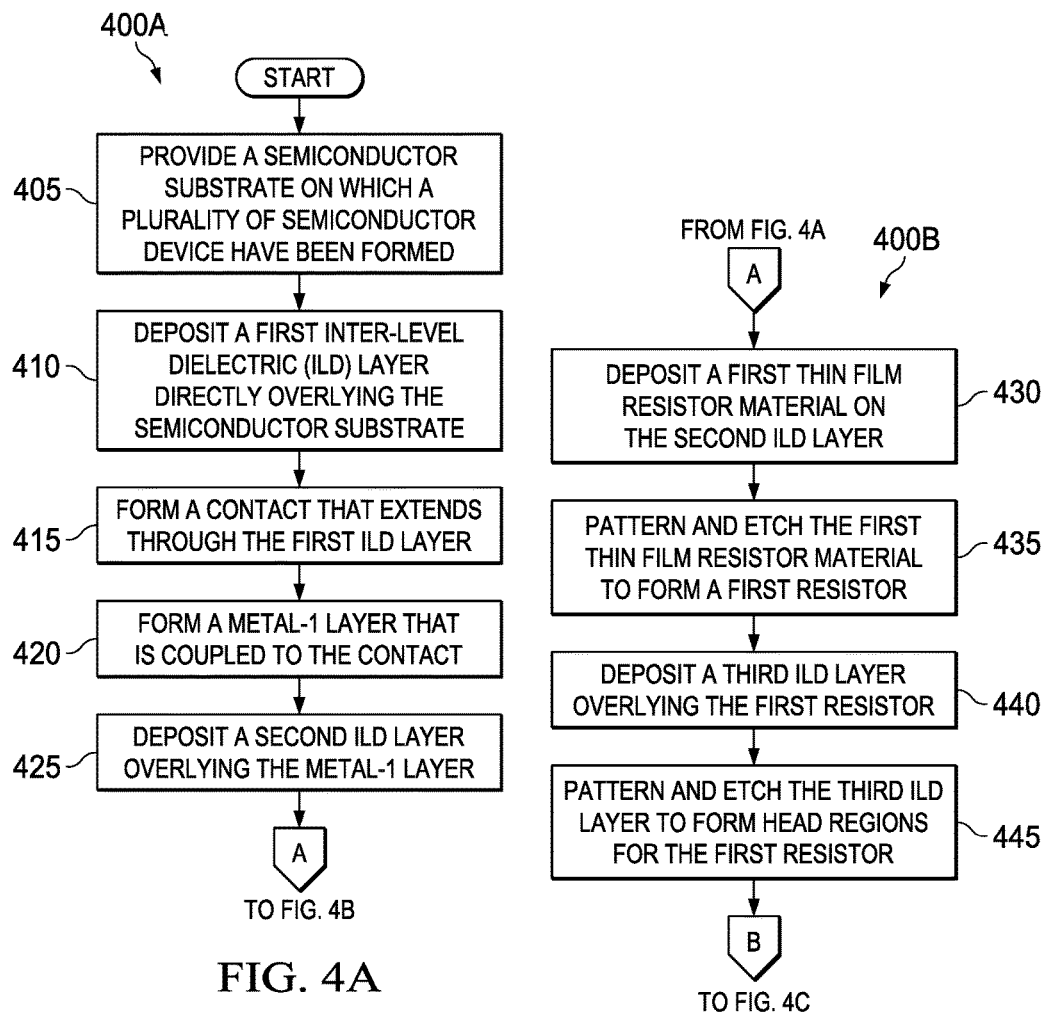
FIG. 4A
FIG. 4B

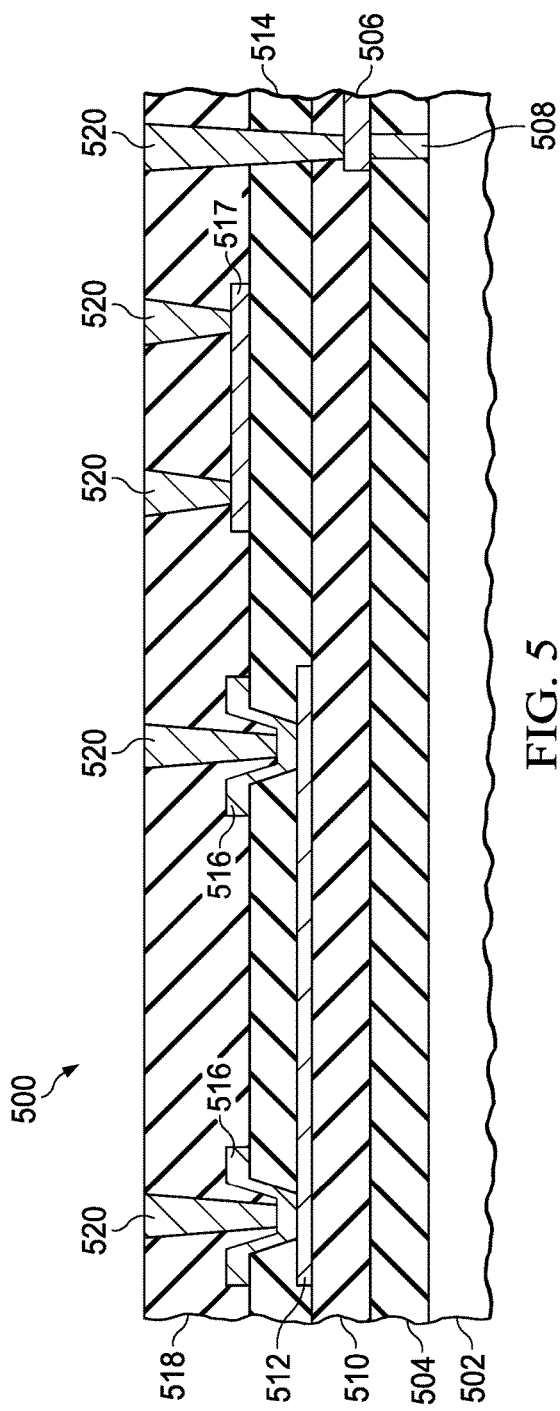
FIG. 5
FIG. 5A
FIG. 5B

DEVICE AND METHOD FOR A THIN FILM RESISTOR USING A VIA RETARDATION LAYER

FIELD OF THE DISCLOSURE

Disclosed embodiments relate generally to the field of Thin Film Resistors (TFRs). More particularly, and not by way of any limitation, the present disclosure is directed to a device and method for a thin film resistor using a via retardation layer.

BACKGROUND

One problem in designing chips with multiple resistors is to ensure that all resistors designed to have the same resistivity will match in the final product, so that the circuit works properly. One factor that adds further complexity to the task of matching TFRs across a chip is the desire to hold down costs by limiting the number of steps and the number of masks required to incorporate a process that forms the TFRs. The inclusion of multiple thin film resistors that require different resistance values can further complicate the process. Improvements are needed.

SUMMARY

Disclosed embodiments are directed to a process for fabricating an integrated circuit having a thin film resistor. The disclosed process utilizes an etch retardant that can be completely etched away during the etching process while providing a gentle landing on the thin film resistor material. The process provides a significant improvement in electrical characteristics and promotes improved resistor matching throughout the integrated circuit by providing a gentle landing for vias on the thin film resistor material while also providing good via coupling to an underlying metal layer.

In one aspect, an embodiment of a method for fabricating an integrated circuit chip is disclosed. The method includes depositing a first thin film resistor material on a first inter-level dielectric (ILD) layer; depositing an etch retardant layer overlying the first thin film resistor material; patterning and etching the etch retardant layer and the first thin film resistor material to form a first resistor; depositing a second ILD layer overlying the first resistor; patterning and etching the second ILD layer using a first etch chemistry to form vias through the second ILD layer and the etch retardant layer to the first resistor, wherein the etch retardant layer is selective to the first etch chemistry and the thickness of the etch retardant layer is such that the via etch removes substantially all exposed portions of the etch retardant layer and substantially prevents consumption of the underlying first thin film resistor material.

In another aspect, an embodiment of an integrated circuit chip is disclosed. The integrated circuit includes a metallization layer; a first dielectric layer directly overlying the metallization layer; a thin film resistor formed on the first dielectric layer; an etch retardant layer overlying the thin film resistor; a second dielectric layer overlying the resistor; a first via located near a first end of the resistor and extending through the first dielectric layer and the etch retardant layer and contacting the thin film resistor; a second via located at an opposite end of the resistor from the first via and extending through the first dielectric layer and the etch retardant layer and contacting the thin film resistor; and a third via extending through the first dielectric layer and the second dielectric layer to contact the metallization layer.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 1A-G depict different stages and layers in the process of forming the resistors shown in FIG. 1 according to an embodiment of the disclosure;

FIG. 3 depicts an example integrated circuit chip having a single type of resistor according to an embodiment of the disclosure;

FIGS. 4A-4E depict an overall method of fabricating a chip containing TFRs according to an embodiment of the disclosure; and FIGS. 5, 5A and 5B depict portions of an IC chip having two different types of resistors on different ILDs and the problems that must be overcome to implement the design.

DETAILED DESCRIPTION OF THE DRAWINGS

Figure 1:
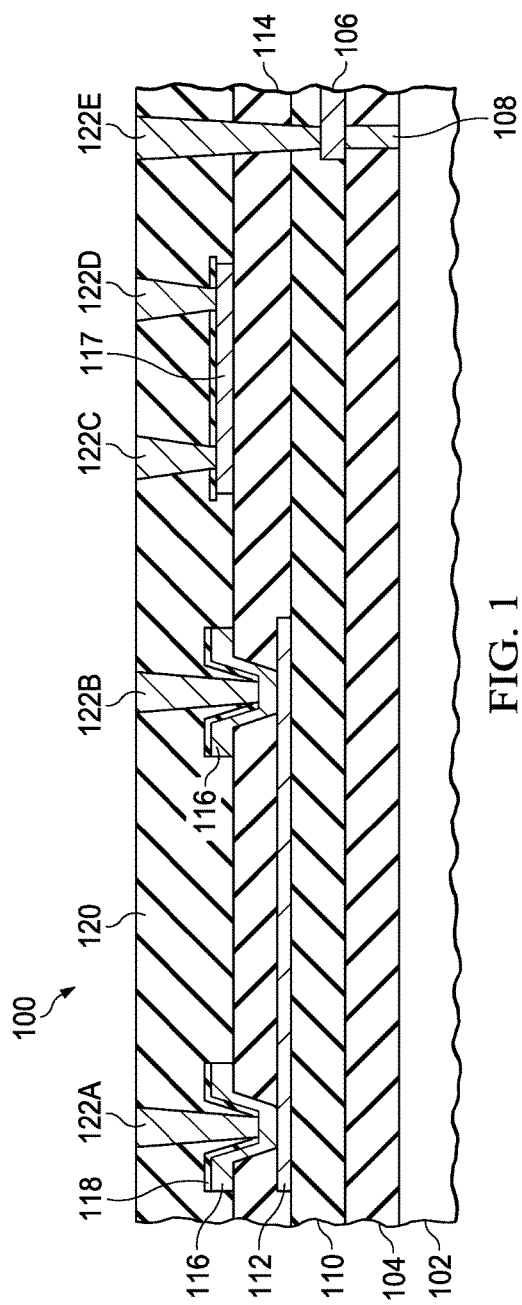
FIG. 1 depicts an example integrated circuit (IC) chip having two different types of resistors on different inter-level dielectric ILD layers according to an embodiment of the disclosure.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. Multiple references to one embodiment are not necessarily to the same embodiment.

FIG. 5 depicts an example chip 500 having two resistors having different resistivity requirements; the two resistors are typically formed on different levels of dielectric. Chip 500 includes a silicon substrate 502 on which the components of an integrated circuit (not specifically shown) have been formed. Two thin film resistors are shown in chip 500, although it will be understood that multiple versions of each of these resistors are typically provided. A thin film resistor is typically defined as having a thickness on the order of 0.1 micrometer or smaller. The two resistors include thin film resistor 512, which is considered a high-sheet resistance resistor (also referred to herein as a High Sheet Resistor (HSR)) and has a resistance substantially between 500-2000 $\Omega/cm^2$, and thin film resistor 517, which is considered a low-sheet resistance resistor (also referred to herein as a Low Sheet Resistor (LSR)) and has a resistance substantially between 50-300 $\Omega/cm^2$. In the example shown, resistors 512, 517 are formed between the metal-1 layer 506 and the metal-2 layer (not specifically shown). Dielectric layer 504 has been formed on silicon substrate 502, with contact 508 extending through dielectric layer 504 and coupling a portion of metal-1 layer 506 to an underlying component (not specifically shown) in substrate 502. Dielectric layer 510 overlies metal-1 layer 506. Resistor 512 is formed on top of dielectric 510, after which an additional dielectric layer 514 has been deposited. Openings through dielectric layer 514 provide a space in which resistor heads 516 can be formed at the same time that resistor 517 is formed. Dielectric layer 518 overlies resistor 517 and resistor heads 516. Vias 520 are all etched simultaneously to contact three separate layers: resistor heads 516, resistor 517 and metal-1 layer 506. In order to provide an etch process that can reach metallization layer 506, care must be taken not to overetch the vias that contact resistor heads 516 and resistor 517.

FIG. 5A depicts chip 500A in which a non-optimized via etch process was used to simultaneously etch vias 520, although only one of the vias etched to resistor 512 is shown. The process was performed with parameters that provide good via characteristics for metal-1 connections, but as can be seen in chip 500A, the etch process has completely punched through resistor 512 and resistor heads 516. One approach to solving this issue is to rely on an etch process that provides very high selectivity to the thin film resistor material. FIG. 5B depicts a chip 500B on which metal-1 vias are etched utilizing an etch process that is highly selective to the thin film resistor material. Although the process shows improvement over the previous via-1 etch, the etch process still punches through or significantly etches into the resistor heads 516 and resistor 512. Another solution is to utilize an etch stop layer that overlies the thin film resistor material deposited to form resistor heads 516 and resistor 517. However, using an etch stop layer requires an additional step to remove the etch stop layer once underlying the via once the etch process is completed. More importantly, Applicant has discovered that the subsequent removal of the etch stop layer does not provide a landing on the thin film resistor material that allows a desired level of resistor matching.

Turning next to FIG. 1, a portion of an IC chip 100 according to an embodiment of the disclosure is shown. IC chip 100 contains a semiconductor substrate 102, on which a dielectric layer 104 has been formed. Semiconductor substrate 102, which can be a silicon wafer or any other semiconductor material, contains plurality of integrated circuit devices that are not specifically shown, as the specific devices formed in the substrate is not part of the present disclosure. For reference, metal-1 layer 106 is shown and contacts a device (not specifically shown) that is formed in semiconductor substrate 102 through contact 108. ILD 110 overlies the metal-1 layer 106 and a resistor 112 has been formed on the surface of ILD 110. Resistor 112 is an HSR, typically having a resistance in the range of 500-2000 $\Omega/cm^2$. In one embodiment, the resistance of resistor 112 is 1000 $\Omega/cm^2$. Two resistor heads 116 are formed at opposite ends of resistor 112. Resistor 117 has been formed with the same layer of thin film resistor material that forms resistor heads 116, as will be explained below. Resistor 117 is an LSR having a resistance in the range of 50-300 $\Omega/cm^2$. In one embodiment, the resistance of resistor 117 is 100 $\Omega/cm^2$. In order to prevent the punch-through or consumption of the thin film resistor material forming resistor heads 116 and resistor 117 during the via etch, a layer of etch retardant 118 is provided on resistor heads 116 and resistor 117. ILD 120 overlies resistor heads 116, resistor 117 and ILD 114 and vias 122A, 122B extend through ILD 120 to contact resistor heads 116, resistor 117 and metal-1 layer 106. Although not specifically shown, the metal-2 layer will be formed on the surface of ILD 120.

The difference between an etch stop material, as utilized in the prior art, and an etch retardation material as utilized in the present disclosure lies primarily in the thickness of the layers and the manner in which the layers are used. An etch stop layer is designed to be thick enough that the etching process does not penetrate through the etch stop layer, but stops with a portion of the etch stop layer intact in order to protect underlying layers. Because the via etch process does not remove the etch stop, a separate process is then utilized to remove the etch stop at the bottom of via. Etch retardant layer 118, on the other hand, is carefully designed to a thickness that will slow the progress of the etch process through the etch retardant layer, but will be substantially completely removed by the etch process while substantially preventing consumption of the underlying thin film resistor material. Careful design of etch retardant layer 118 in light of the specific stack utilized in the wafer manufacturing allows the etch process to land gently on each of resistor heads 116, resistor 117 and metal-1 layer 106 substantially simultaneously.

FIGS. 1A-1G depict various stages in a method of forming chip 100. For the purpose of the present disclosure, the method begins after semiconductor substrate has been processed to create multiple devices, dielectric layer 104 has been formed, metal-1 layer 106 and contacts 108 have been formed and ILD 110 has been deposited. While each of the above mentioned layers is important to the IC chip as a whole, the specific process utilized to form these layers is irrelevant to the disclosed method and is not discussed in detail. The disclosed method begins with the deposition of a layer of thin film resistor material 112A that will form resistor 112. In one embodiment, thin film resistor material 112A is silicon chromium (SiCr). In one embodiment, thin film resistor material 112A is nickel chromium (NiCr). Other materials that can be utilized as thin film resistor material 112A include alloys of SiCr and NiCr that incorporate carbon and/or oxygen. A generalized formula for the thin film resistor material can be written as $Cr_VC_WSi_XN_YO_Z$, where V, W, X, Y and Z are each between zero and four inclusive. The thickness of thin film resistor material 112A can be in the range of 20-100 Angstroms. In one embodiment, thin film resistor material 112A has a thickness of 32 Angstroms.

Figure 1A:
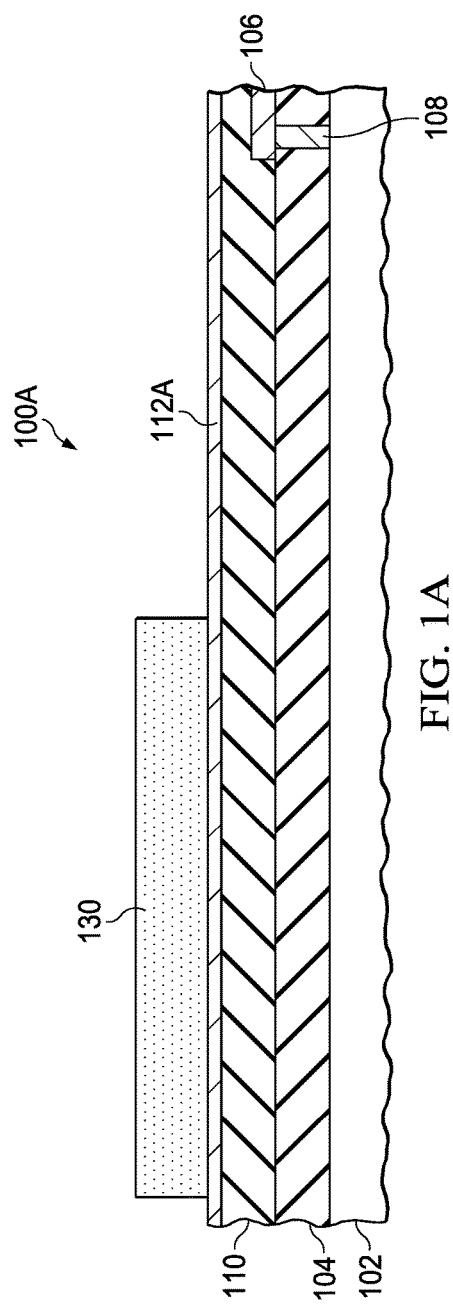
Figure 1B:
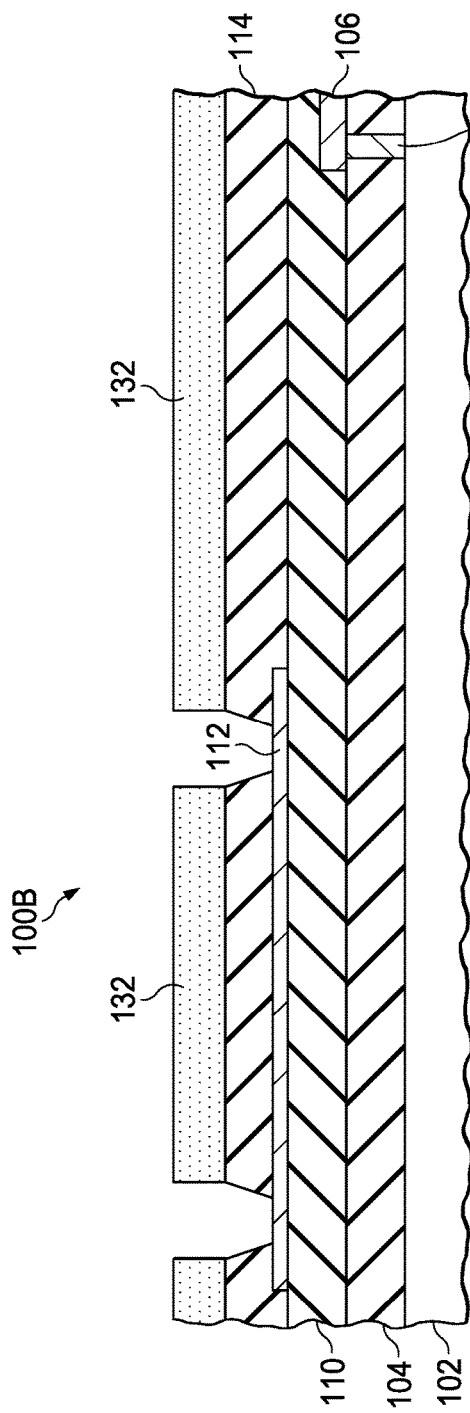

After thin film resistor material 112A has been deposited, a layer of photoresist 130 is deposited and patterned to cover only those portions of thin film resistor material 112A where thin-film resistors are desired. As shown in chip 100A, the wafer is ready for an etching process to remove portions of thin film resistor material 112A that are not covered by photoresist 130. Once the etching process is completed, resistor 112 has been formed and an ILD 114 that defines the head thickness for resistor 112 is deposited. As seen in FIG. 1B, photoresist layer 132 has been deposited on ILD 114 of chip 100B and patterned to expose head regions on opposite ends of resistor 112, followed by an etching process that stops on the surface of resistor 112.

Once the etching process for the head regions of resistor 112 is completed, photoresist 132 is removed and thin film resistor material 116A is deposited. At those locations where openings for head regions have been etched through ILD 114, thin film resistor material 116A will line the edges of the contact openings; in all other areas of the surface of ILD 114, thin film resistor material 116A forms a flat layer. As in resistor 112, thin film resistor material 116A can be SiCr, NiCr or any alloy of these two materials that incorporates carbon and/or oxygen. The thickness of thin film resistor material 116A can be in the range of 250-500 Angstroms. In one embodiment, thin film resistor material 116A has a thickness of 400 Angstroms. An etch retardant layer 118 is then deposited overlying layer 114; etch retardant layer 118 follows the contours of thin film resistor material 116A. In one embodiment, etch retardant layer 118 comprises a tri-layer sandwich of material in which a thin layer of etch retardant is sandwiched between two dielectric layers.

FIG. 1D depicts one embodiment of a tri-layer of material 100D that forms etch retardant layer 118. At the lowest level in this embodiment, a dielectric layer 119 directly overlies thin film resistor material 116A and prevents etch retardant layer 121 from contacting thin film resistor material 116A to prevent any unwanted reactions between etch retardant layer 121 and thin film resistor material 116A. A dielectric layer 123 can be any appropriate dielectric, such as an oxide or nitride and can have a thickness in the range of 0-500 Angstrom. In one embodiment, dielectric layer 119 is an oxide having a thickness of 100 Angstroms. Etch retardant layer 121 forms the middle of the three layers and can be formed of a nitride, silicon carbide or other dielectric of the same nature that is selective to the etching process. In at least one embodiment, the etch retardant layer 121 is highly selective to the etching process. Etch retardant layer 121 can have a thickness in the range of 50-700 Angstrom. In one embodiment, etch retardant layer 121 comprises 400 Angstroms of silicon nitride. The exact thickness of etch retardant layer 121 is based on the stack utilized and the specific etch process. The third layer of tri-layer 100D is a dielectric layer 123 that serves as a hard mask. In one embodiment, dielectric layer 123 comprises 150 Angstroms of oxide.

Figure 1C:
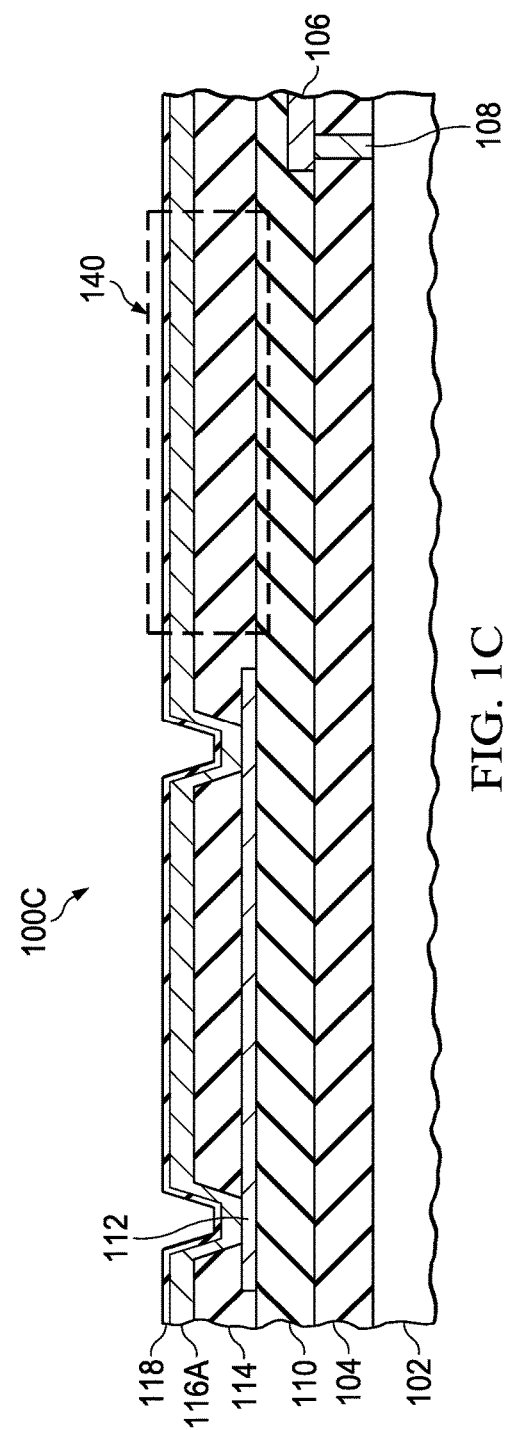
Figure 1G:
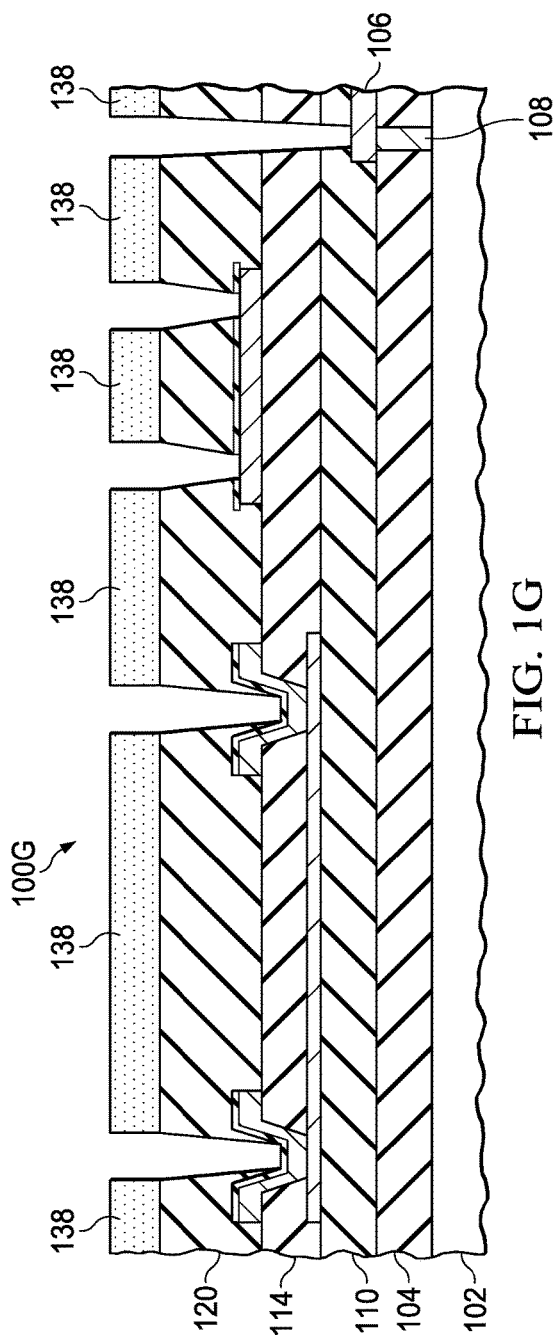

FIG. 1E depicts the region enclosed by dotted line 140 in FIG. 1C and includes only a few of the layers, which have been enlarged for clarity. After the deposition of etch retardant layer 118, which comprises layers 119, 121, 123, a photoresist layer 134 is deposited and patterned to remove portions of thin film resistor material 116A outside of the desired resistors 116. As seen in FIG. 1E, layers 119, 121, 123 of etch retardant layer 118 have been etched through, but the underlying layer 116A has not yet been etched. In the disclosed embodiment, following the etching process to remove etch retardant layer 118, remaining portions of photoresist 134 are ashed and the wafer is cleaned. The ashing and cleaning are performed to prevent certain undesirable device effects. This is followed by the deposition of photoresist layer 136, which is patterned and utilized to etch away unwanted portions of thin film resistor material 116A to form resistor heads 116 and resistor 117, followed by the removal of photoresist 136. Notably, the mask utilized for etching in FIG. 1E and the mask utilized for etching in FIG. 1F are the same mask.

ILD 120 is then deposited overlying resistor 117 and resistor heads 116. The final element in the disclosed method is to form the vias 120. Photoresist 138 is deposited on ILD 120 and patterned for the etching process. Typically, the via etch chemistry utilizes a fluorinated plasma, such as $CF_4$, $C_XF_Y$, $C_XH_YF_Z$, where X=1-4, Y=1-4 and Z=1-4. The via etch chemistry can also utilize an argon plasma or oxygen plasma. The layers of inter-level dielectric can vary in thickness from about 4000 Angstroms to about 1 micron and can vary from level to level. The materials utilized for ILD layers 104, 110, 114 can include a dielectric such as silicon dioxide deposited using plasma excited chemical vapor deposition (PECVD), plasma excited TEOS deposition (PE-TEOS), or may be a fluorinated or low-k dielectric. The dielectric for layer 120 can be an oxide, a doped oxide, a low-k dielectric, or fluorosilicate glass (FSG). The critical dimension of the vias can be in the range of 0.15 microns-1.0 micron. Thickness of the etch retardant will have been carefully calibrated such that the etch retardant is removed by the etching process but does not allow the etching process to consume substantially any of thin film resistor material 116A. The disclosed process allows the via etching process to land gently on three different levels substantially simultaneously. Notably, adding two types of resistors to the process flow requires only three additional masks: a first mask to provide the photoresist layout as shown in FIG. 1A, a second mask to provide the photoresist layout as shown in FIG. 1B and a third mask used for both the photoresist layout as shown in FIG. 1E and the photoresist layout as shown in FIG. 1F. (The mask utilized to pattern the chip in FIG. 1G for vias is necessary for other portions of the chip and is not an added element.) Of course, it is also possible to utilize the disclosed method when only a single type of TFR is added to the process; the single type of TFR can be either an HSR or an LSR. In this situation, the masks necessary for defining a second resistor is not necessary, nor is the mask for defining heads for the underlying resistors.

Figure 2:
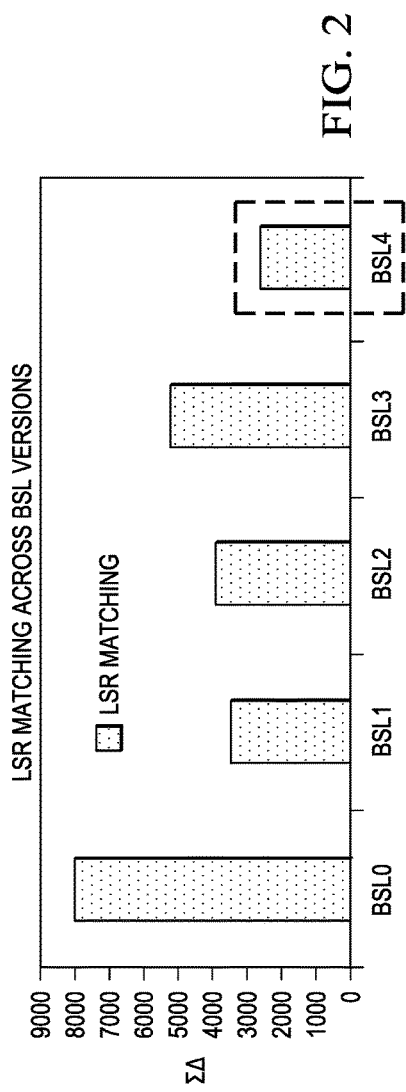
FIG. 2 compares the ability of several different processes, including the disclosed method, to provide low sheet resistor matching.

FIG. 2 depicts LSR matching for the disclosed method in comparison to other methods that were explored. The X-axis depicts the separate methods, while the Y-axis depicts a match number that represents an accumulation ($\Sigma$) of the differences ($\Delta$) between resistors on the chip. Ideally, the $\Sigma\Delta$ is zero. BSL0 was a starting point and gave a poor $\Sigma\Delta$ value of about 8000. Other tested processes BSL1, BSL2, BSL3 provided $\Sigma\Delta$ values ranging between about 3500 and 5200. The disclosed process, shown as BSL4 was the only process to drop the $\Sigma\Delta$ below 3000, to a value of about 2600. Improvements in other elements of resistor matching can now be explored to further drop the value of $\Sigma\Delta$.

FIG. 3 depicts a portion of an IC chip 300 that utilizes the disclosed process, but only contains one type of resistor, which in this embodiment is an LSR. IC chip 300 contains a semiconductor substrate 302, on which devices have been formed but are not specifically shown. ILD 304 overlies semiconductor substrate 302 and contains contact 308, which extends through ILD 304 to couple metal-1 layer 306 to a device (not specifically shown) that is built in the substrate 302. A second ILD layer 310 overlies metal-1 layer 306 and supports resistor 317. Etch retardant layer 318, which can again be a tri-layer, covers the top surface of resistor 317, but is pierced by vias 322; other vias 322 are also present to provide electrical contact with the metal-1 layer. ILD 320 overlies resistor 317. When only LSR resistors are utilized, neither the mask shown in FIG. 1A for etching resistor 112, nor the mask shown in FIG. 1B for etching contacts to resistor 112 is necessary, so providing a single type of resistors requires only a single additional mask, i.e., for etching the boundaries of resistor 117. Using etch retardant layer 318 allows the etching process to land gently on both resistor 304 and metal-1 layer 106 substantially simultaneously.

Figure 4C:
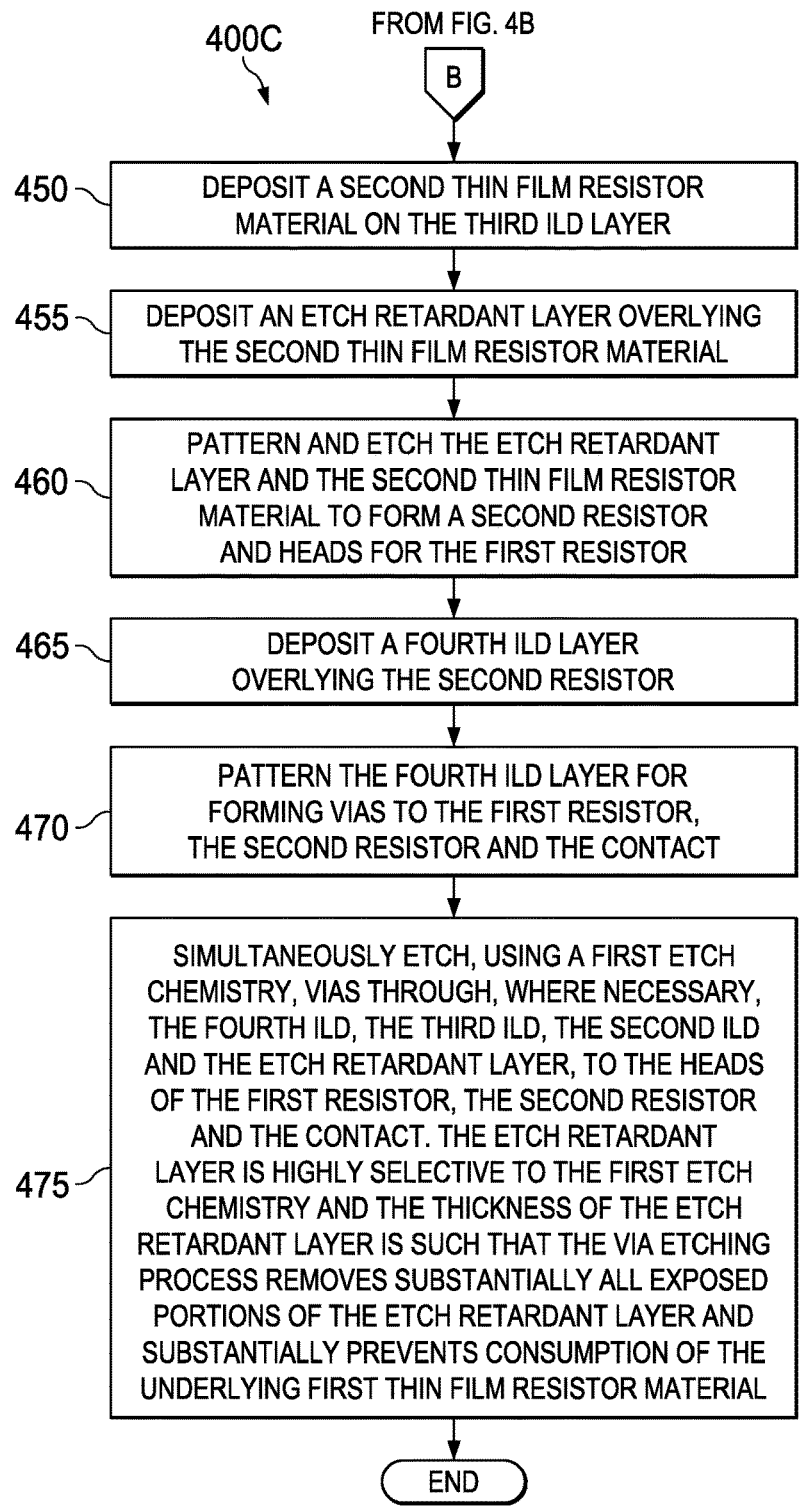
Figure 4D:
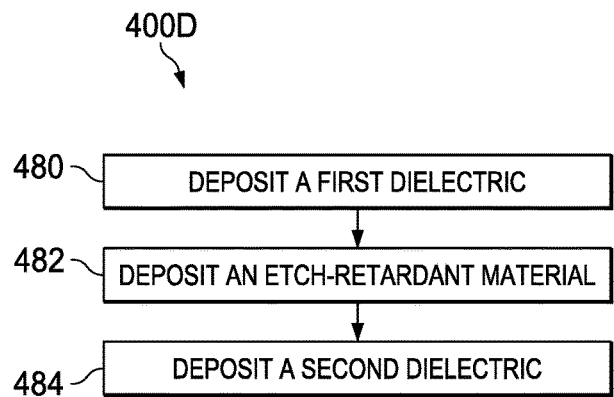

Turning next to FIGS. 4A-D, a series of flowcharts depicting a method 400 for improving TFR matching on an IC chip are shown. The method is directed to forming two different types of resistors on the chip, although the elements that are eliminated when forming only one type of resistors are noted. In FIG. 4A, flowchart 400A starts the process with providing (405) a semiconductor substrate on which a plurality of semiconductor devices have been formed. As previously noted, the exact nature of the devices formed in and on the semiconductor substrate is not relevant to the disclosed method. Any type of electronic device can have been formed in any type of semiconductor substrate. The method continues with depositing (410) a first ILD layer that directly overlies the semiconductor substrate. A contact is formed (415) that extends through the first ILD layer; it will be understood that there are generally hundreds or thousands of such contacts formed on a single chip. A metallization layer that is coupled to the contact is also formed (420). The specific metal process or metal utilized can be any known or unknown process. In the example previously shown, this layer was the metal-1 layer, so that the resistors were formed between the metal-1 and metal-2 layers; however, resistors placed between other metallization layers would also fall within the scope of this disclosure. Next, a second ILD layer is deposited (425) overlying the metallization layer In FIG. 4B, method 400B continues with depositing (430) a first thin film resistor material on the second ILD layer. This layer of thin film resistor material is patterned and etched (435) to form a first resistor, i.e., to define the boundaries of the resistor. A third ILD layer is then deposited (440) overlying the first resistor; this third ILD layer is patterned and etched (445) to form head regions for the first resistor. The method represented by flowchart 400B, including elements 430-445, can be eliminated when only one type of resistor is necessary for a particular embodiment.

FIG. 4C continues with flowchart 400C by depositing (450) a second thin film resistor material on the third ILD layer This second thin film resistor material will be deposited on the surface of the third ILD layer and, if two types of resistors are being provided, will also be deposited on the surface of the head regions etched to the first resistor. An etch retardant layer is deposited (455) overlying the second thin film resistor material. In one embodiment, the etch retardant layer is a tri-layer hardmask, whose deposition requires three separate deposition processes, shown in FIG. 4D. In process 400D, a first dielectric is deposited (480), followed by depositing (482) an etch-retardant material. Finally, a second dielectric is deposited (484) over the etch-retardant material.

Figure 4E:
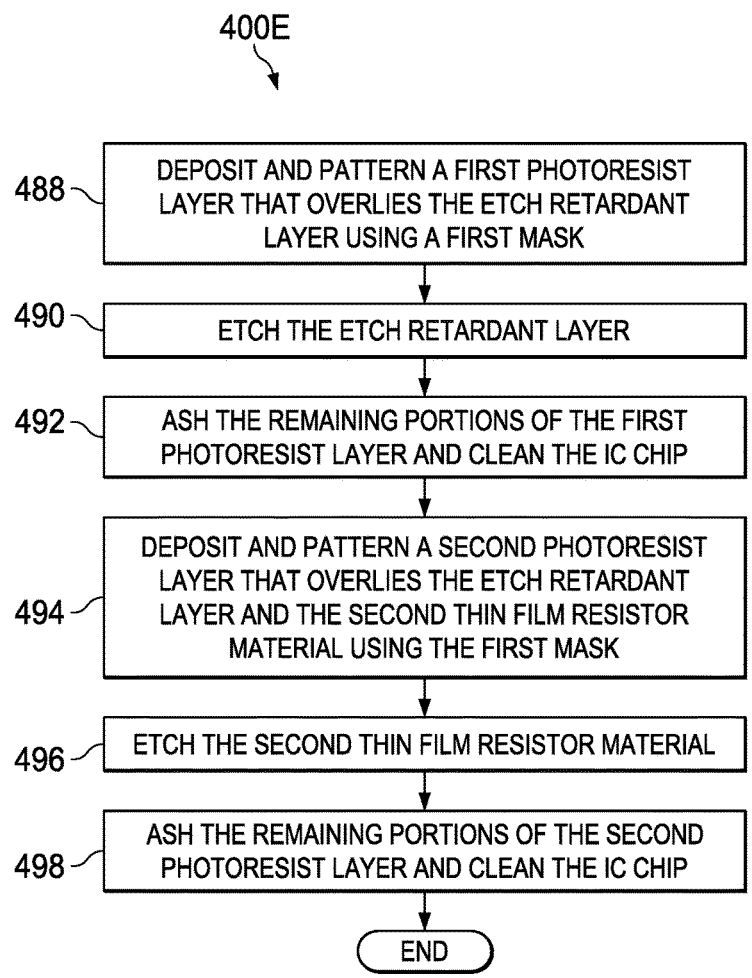

Returning the method 400C, once the etch retardant layer has been deposited, both the etch retardant layer and the second thin film resistor material are patterned and etched (460) to form a second resistor and first resistor heads. One embodiment of this process is shown in greater detail in FIG. 4E, where method 400E includes depositing and patterning (488) a first photoresist layer that overlies the etch retardant layer using a first mask, followed by etching (490) the etch retardant layer. Remaining portions of the first photoresist layer are ashed (492) and the IC chip is cleaned. This is followed by depositing and patterning (494) a second photoresist layer that overlies the etch retardant layer and the second thin film resistor material, also using the first mask. The second conductive material is etched (496). This is followed by ashing (498) the remaining portions of the second photoresist layer and cleaning the IC chip. Returning again to method 400C, a fourth ILD layer is deposited (465) overlying the second resistor, followed by patterning (470) the fourth ILD layer for forming vias to the heads of the first resistor, the second resistor and the contact. The method then simultaneously etches, using a first etch chemistry, vias to the heads of the first resistor, the second resistor and the contact. Because the etch retardant layer is selective to the first etch chemistry and the thickness of the etch retardant layer was carefully selected, the via etching process removes substantially all exposed portions of the etch retardant layer and substantially prevents consumption of the underlying first thin film resistor material. This ends the disclosed method, although of course there are further processes that will be performed on the IC chip before the chip is considered complete, such as deposition of the metal-2 layer.

The disclosed device and method for improving TFR matching on an IC chip demonstrate improved resistor matching due to the improved landing of the vias on the thin film resistors. The disclosed process provides a smoother and controlled ohmic contact to the TFR or TFR head. An etch retardant layer, which can be SiN, SiON, SiC other compound that provides the desired selectivity to the etching process, overlies a top conductive layer that defines a TFR and can also define heads for underlying TFRs. The thickness of the etch retardant layer is determined in respect to the specific etch utilized and the layers through which the etch must work and is carefully tweaked to achieve a gentle landing on the resistors and resistor heads.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method for fabricating an integrated circuit (IC) chip, the method comprising:
   depositing a first thin film resistor material on a first inter-level dielectric (ILD) layer;
   depositing an etch retardant layer overlying the first thin film resistor material;
   patterning and etching the etch retardant layer and the first thin film resistor material to form a first resistor;
   depositing a second ILD layer overlying the first resistor;
   patterning and etching the second ILD layer using a first etch chemistry to form vias through the second ILD layer and the etch retardant layer to the first resistor, wherein the etch retardant layer is selective to the first etch chemistry and the thickness of the etch retardant layer is such that the via etch removes substantially all exposed portions of the etch retardant layer and substantially prevents consumption of the underlying first thin film resistor material, and prior to depositing the first thin film resistor material:
depositing a second thin film resistor material on a third ILD layer that overlies a metallization layer;
patterning and etching the second thin film resistor material to form a second resistor;
depositing the first ILD layer overlying the second resistor; and
patterning and etching the first ILD layer to form head regions for the second resistor; wherein
depositing the first thin film resistor material comprises depositing the first thin film resistor material in the head regions,
the patterning and etching the etch retardant layer and the first thin film resistor material further forms resistors heads for the second resistor, and
the patterning and etching the second ILD layer further forms vias through the first ILD layer and the etch retardant to the head regions for the second resistor.

2. The method as recited in claim 1 wherein depositing the etch retardant layer comprises depositing a first dielectric, depositing an etch-retardant material and depositing a second dielectric.

3. The method as recited in claim 1 wherein the etch retardant material is selected from a group comprising silicon nitride and silicon carbide.

4. The method as recited in claim 2 wherein the etch retardant material has a thickness in the range of between about 50-700 Angstroms.

5. The method as recited in claim 1 further comprising, prior to depositing the second thin film resistor material:
providing a semiconductor substrate on which a plurality of semiconductor devices have been formed;
depositing a fourth ILD layer directly overlying the semiconductor substrate;
forming a contact that extends through the fourth ILD layer;
forming the metallization layer that is coupled to the contact; and
depositing the third inter-level dielectric;
wherein the patterning and etching the second ILD layer further forms vias through the first, second and third ILD layers to the contact.

6. The method as recited in claim 1 wherein the first thin film resistor material and the second thin film resistor material each comprises a material selected from a group comprising silicon chromium, nickel chromium, chromium silicon oxide, silicon oxynitride and $Cr_VC_WSi_XN_YO_Z$, where V, W, X, Y and Z are between zero and four inclusive.

7. The method as recited in claim 1 wherein the first etch chemistry is selected from a group comprising argon, oxygen, $CF_Y$, $C_XF_Y$ and $C_XH_YF_Z$, where each of X, Y and Z is equal to a number between 1 and 4 inclusive.

8. A method for fabricating an integrated circuit (IC) chip, the method comprising:
depositing a first thin film resistor material on a first inter-level dielectric (ILD) layer;
depositing an etch retardant layer overlying the first thin film resistor material;
patterning and etching the etch retardant layer and the first thin film resistor material to form a first resistor;
depositing a second ILD layer overlying the first resistor;
patterning and etching the second ILD layer using a first etch chemistry to form vias through the second ILD layer and the etch retardant layer to the first resistor, wherein the etch retardant layer is selective to the first etch chemistry and the thickness of the etch retardant layer is such that the via etch removes substantially all exposed portions of the etch retardant layer and substantially prevents consumption of the underlying first thin film resistor material, wherein patterning and etching the etch retardant layer and the first thin film resistor material comprises:
depositing and patterning a first photoresist layer that overlies the etch retardant layer using a first mask;
etching the etch retardant layer;
ashing the remaining portions of the first photoresist layer and cleaning the IC chip;
depositing and patterning a second photoresist layer that overlies the etch retardant layer and the first thin film resistor material using the first mask;
etching the first thin film resistor material; and
ashing the remaining portions of the second photoresist layer and cleaning the IC chip.

9. A method for fabricating an integrated circuit (IC) chip, the method comprising:
providing a semiconductor substrate on which a plurality of semiconductor devices have been formed;
depositing a first inter-level dielectric (ILD) layer directly overlying the semiconductor substrate;
forming a contact that extends through the first ILD layer;
forming a metallization layer that is coupled to the contact; and
depositing a second ILD;
depositing a first thin film resistor material on the second ILD layer;
patterning and etching the first thin film resistor material to form a first resistor;
depositing a third ILD layer overlying the first resistor;
patterning and etching the third ILD layer to form head regions for the first resistor;
depositing a second thin film resistor material on the third ILD layer;
depositing an etch retardant layer overlying the second thin film resistor material;
patterning and etching the etch retardant layer and the second thin film resistor material to form a second resistor and resistor heads for the first resistor;
depositing a fourth ILD layer overlying the second resistor;
patterning the fourth ILD layer for forming vias to the heads of the first resistor, the second resistor and the contact; and
simultaneously etching, using a first etch chemistry, vias through, where necessary, the fourth ILD, the third ILD, the second ILD and the etch retardant layer to the first resistor, the heads of the second resistor and the contact wherein the etch retardant layer is selective to the via etch and the thickness of the etch retardant layer is such that the via etch removes substantially all exposed portions of the etch retardant layer and substantially prevents consumption of the underlying first and second thin film resistor materials.

10. A integrated circuit (IC) chip comprising:
a metallization layer;
a first dielectric layer directly overlying the metallization layer;
a first thin film resistor formed on the first dielectric layer;
a second dielectric layer overlying the first thin film resistor
a second thin film resistor formed on the second dielectric layer, the second thin film resistor comprising a resistor material wherein a portion of the resistor material also forms resistor heads through the second dielectric layer to the first thin film resistor;

an etch retardant layer overlying the resistor material of both the second thin film resistor and the resistor heads;

a third dielectric layer overlying the second thin film resistor;

a first via and a second via extending through the third dielectric layer and the etch retardant layer to the second thin film resistor;

a third via and a fourth via extending through the third dielectric layer, part of the second dielectric layer and the etch retardant layer to the resistor heads of the first thin film resistor; and a fifth via extending through the third dielectric layer, the second dielectric layer, and the first dielectric layer to contact the metallization layer.

11. The IC chip as recited in claim 10, wherein the first thin film resistor and the resistor material comprise a material selected from a group comprising silicon chromium, nickel chromium, chromium silicon oxide, silicon oxynitride and $Cr_VC_WSi_XN_YO_Z$, where V, W, X, Y and Z are each between zero and four inclusive.

12. The IC chip as recited in claim 10, wherein the etch retardant layer comprises a tri-layer of a first dielectric, an etch retardant material and a second dielectric.

13. The IC chip as recited in claim 10, wherein the etch retardant material comprises a material selected from a group comprising SiN, SiON, SiC.

14. The IC chip as recited in claim 10, wherein the etch retardant material has a thickness in the range of between about 50-700 Angstroms.

* * * * *